US009903930B2

(12) United States Patent
Wastling et al.

(10) Patent No.: US 9,903,930 B2
(45) Date of Patent: Feb. 27, 2018

(54) RF PULSES FOR MAGNETIC RESONANCE

(71) Applicant: King's College London, London (GB)

(72) Inventors: Stephen James Wastling, London (GB); Gareth John Barker, London (GB)

(73) Assignee: King's College London (GB)

( * ) Notice: Subject to any disclaimer, the term of this patent is extended or adjusted under 35 U.S.C. 154(b) by 648 days.

(21) Appl. No.: 14/522,813

(22) Filed: Oct. 24, 2014

(65) Prior Publication Data

US 2015/0123662 A1 May 7, 2015

Related U.S. Application Data

(60) Provisional application No. 61/900,557, filed on Nov. 6, 2013.

(51) Int. Cl.
*G01R 33/56* (2006.01)
*G01R 33/565* (2006.01)
*G01R 33/483* (2006.01)

(52) U.S. Cl.
CPC ... *G01R 33/56536* (2013.01); *G01R 33/4833* (2013.01)

(58) Field of Classification Search
CPC .......... G01R 33/56536; G01R 33/4833; G01R 33/246; G01R 33/5612; G01R 33/385; G01R 33/288; G01R 33/583; G01R 33/341; G01R 33/4814; G01R 33/4836; G01R 33/5617; G01R 33/243; G01R 33/3415; G01R 33/4828; G01R 33/50; G01R 33/543; G01R 33/28; G01R 33/5659; A61B 5/055
See application file for complete search history.

(56) References Cited

U.S. PATENT DOCUMENTS

| | | | | |
|---|---|---|---|---|
| 7,777,484 | B2 * | 8/2010 | Garwood | G01N 24/10 324/307 |
| 2008/0204020 | A1 * | 8/2008 | Chamberlain | G01R 33/5615 324/312 |
| 2016/0124060 | A1 * | 5/2016 | Giri | G01R 33/543 324/309 |

* cited by examiner

*Primary Examiner* — Clayton E Laballe
*Assistant Examiner* — Ruifeng Pu
(74) *Attorney, Agent, or Firm* — John Bruckner PC

(57) ABSTRACT

The present invention provides a method and system to reduce the problem of signal dropout in data acquired using gradient-echo and asymmetric spin-echo magnetic resonance techniques, caused by linear susceptibility gradients in the direction of slice-selection. Specifically an algorithm is used to determine the optimal parameters of a tailored radiofrequency pulse along with the accompanying slice-selection and slice-refocusing gradients to correct this signal dropout.

16 Claims, 9 Drawing Sheets

Conventional GE-EPI

GE-EPI with exemplar RF pulse and associated gradients

RF PULSES FOR MAGNETIC RESONANCE

CROSS REFERENCE TO RELATED APPLICATION

This application claims priority under 35 USC 119(e) from U.S. provisional patent application No. 61/900,557 filed 6 Nov. 2013, the entire contents of which are incorporated herein by reference.

TECHNICAL FIELD

The present invention relates to the field of Magnetic Resonance Imaging (MRI) and Magnetic Resonance Spectroscopy (MRS). In particular, it relates to a method and system for designing a radiofrequency pulse along with the accompanying slice-selection and slice-refocusing gradients to reduce signal dropout in data acquired using gradient-echo or asymmetric spin-echo Magnetic Resonance (MR) techniques in regions of varying magnetic susceptibility.

BACKGROUND TO THE INVENTION AND PRIOR ART

Nuclear magnetic resonance is observed in materials containing nuclei with non-zero spin angular momentum. Associated with their spin angular momentum, S, these nuclei possess a magnetic dipole moment, $\mu$. In a static magnetic field, $B_0$, these dipole moments have a discrete set of spin eigenstates which are populated according to the Boltzmann distribution. This results in a net magnetisation, M, parallel to $B_0$ which can be manipulated by radiofrequency (RF) pulses at the Larmour frequency. If the net magnetisation is rotated away from the direction of $B_0$ by an RF pulse, there is a non-zero transverse magnetisation that precesses at the Larmour frequency, $\omega$, resulting in a signal that can be detected with an RF coil. This signal decays away over time due to both spin-lattice and spin-spin relaxation mechanisms.

To form an image of the object the signal can be localised in space by applying linear magnetic field gradients. These result in known linear variations in the static magnetic field as a function of position. A series of measurements of the signal are performed during which the gradients are altered according the particular localisation method being employed. The image is then calculated from these measurements using one of several well known reconstruction techniques.

Slice- (or slab-) selection is commonly used in MRI and MRS to excite the magnetisation over a volume ("slice") of thickness $\Delta z$. A slice-selection gradient is applied, which causes the precession frequency of the net magnetisation to vary linearly with spatial position. An RF pulse with bandwidth, $\Delta f$, is applied concurrently with the slice-selection gradient, at an amplitude, $G_z$, such that only the net magnetisation within the slice is rotated away from the direction of $B_0$. The thickness of the slice, $\Delta z$, is related to the bandwidth, the amplitude of the slice-selection gradient, $G_z$, and the gyromagnetic ratio, $\gamma$, by:

$$\Delta z = \frac{2\pi \Delta f}{\gamma G_z} \quad (1)$$

If the static magnetic field is spatially inhomogeneous, the resulting data can suffer from signal dropout. Signal dropout is a particular problem for data acquired with gradient-echo and asymmetric spin-echo techniques. Localised inhomogeneities may result from magnetic susceptibility gradients at the boundaries within the object being imaged. These localised magnetic field inhomogeneities occur for example near bone, soft-tissue and air interfaces in the human head causing signal dropout in the images of the brain in the vicinity of these areas. The signal dropout is caused by dephasing of the transverse magnetisation by the susceptibility gradients.

A number of techniques have been suggested to reduce the problem of signal dropout caused by susceptibility gradients. These include reducing the echo time or the voxel volume, localised magnetic field shimming, dynamic shim updating, the use of passive shims constructed from diamagnetic materials, localised active shimming, z-shimming, and compensation gradients in the frequency and phase encoding directions.

An alternative approach is to use tailored RF pulses for slice selection. Z. H. Cho and Y. M. Rho, "Reduction of Susceptibility Artifact in Gradient-Echo Imaging", *Magnetic Resonance in Medicine*, 23, 193-200, 1992 [1], introduced the concept that the phase dispersion caused by a linear susceptibility gradient could be partially cancelled using a tailored RF pulse, therefore reducing signal dropout. The tailored RF pulse induces a quadratic (or approximately quadratic) phase variation in the transverse magnetisation in the direction of slice selection, $\phi_{RF}(Z)$ as given by equation 2.

$$\phi_{RF}(z) = az^2 \quad (2)$$

Here, the parameter a governs the degree of quadratic variation in the phase of the transverse magnetisation induced by the RF pulse. In addition Cho and Rho developed an analytical model describing how the MR signal varies as a function of the susceptibility gradient and the parameter a. The model was used to determine the value of the parameter a needed to reduce signal dropout. In addition, it highlighted that there is a trade-off between signal recovery in areas with susceptibility gradients and a reduction of signal in areas of homogeneous magnetic field when RF pulses which induce a quadratic phase variation in the phase of the transverse magnetisation are used. Cho and Rho demonstrated that the problem of signal loss in images of the human head could be reduced using such a pulse. However they did not specify how the RF pulse could be produced in practice; neither an algorithm nor functional form was described. In addition, the analytical model they described was based on the simplifying assumption that the excited slices in MRI have perfectly rectangular slice profiles. This is not achievable in practice and as such their model is inaccurate and therefore cannot be used to accurately determine the degree of quadratic phase variation, a, that the RF pulse needs to induce to reduce signal dropout from a particular range of susceptibility gradients. Three further manifestations of tailored RF pulses, all based on the concept described by Cho et al., have been described.

J. Y. Chung, H. W. Yoon, Y. B. Kim, H. W. Park, Z. H. Cho, "Susceptibility Compensated fMRI Study Using a Tailored RF Echo Planar Imaging Sequence", *Journal of Magnetic Resonance Imaging*, 29, 221-228, 2009 [2], used the analytical model of Cho et al. to select the degree of quadratic phase variation, a, induced by the RF pulse such that the signal loss in areas of homogeneous magnetic field was reduced relative to the previously published implementation, although at a cost of less effective recovery of signal dropout. It should be noted however that they found large discrepancies between the signal recovery found experimentally and that predicted theoretically by the model of Cho et al, reinforcing the claim made above that the model of Cho et al. is inaccurate and therefore should not be used to determine the optimal degree of quadratic phase variation, a. Again, Chung et al. did not specify how the RF pulse they used could be produced in practice.

Both J. Mao and A. W. Song, "Intravoxel rephasing of spins dephased by susceptibility effect for EPI sequences", In: *Proceedings of the International Society for Magnetic Resonance in Medicine, 1999, Philadelphia.* p. 1982[3], and K. Shmueli, D. L. Thomas and R. Ordidge, "Signal Drop-Out Reduction in Gradient Echo Imaging with a Hyperbolic Secant Excitation Pulse—An Evaluation Using an Anthropomorphic Head Phantom", In: *Proceedings of the International Society for Magnetic Resonance in Medicine, 2006 Seattle.* p. 2385[4], used complex hyperbolic secant RF pulses to generate approximately quadratic phase profiles in the transverse magnetisation. Such pulses, with duration $T_{RF}$, have a magnetic field $B_1$ perpendicular to the static magnetic field $B_0$ that varies with time, t, according to:

$$B_1(t) = [A_0 \sec h(\beta t)]^{1+i\mu} \quad (3)$$

In equation 3, $A_0$ is the peak amplitude of the RF pulse, $\beta$ is known as the modulation angular frequency, $$-\frac{T_{RF}}{2} < t < \frac{T_{RF}}{2}, i = \sqrt{-1}$$

and as shown by Shmueli et al. the parameter $\mu$ is proportional to the degree of quadratic phase variation, a. Additionally Mao et al. tailored the area of the slice-refocusing gradient (a procedure referred to as z-shimming, as first suggested by J. Frahm, M. Klaus-Dietmar, and H. Wolfgang, "Direct FLASH MR imaging of magnetic field inhomogeneities by gradient compensation", *Magnetic Resonance in Medicine*, 6, 4, 474-480, 1988 [5]) in an effort to further reduce signal dropout. Neither Shmueli et al. nor Mao et al. described a method to systematically determine the parameters of the RF pulse or the accompanying slice-selection and slice-refocusing gradients to correct the problem of signal dropout caused by a specific range of linear susceptibility gradients. In addition, both Shmueli et al. and Mao et al. incorrectly assumed that the frequency bandwidth of the pulse (used to determine the slice-selection gradient amplitude for a given slice thickness) was given by $$\frac{\mu\beta}{\pi}.$$

SUMMARY OF INVENTION

Embodiments of the invention address the above noted problems by providing a method and system to reduce the problem of signal dropout, caused by linear susceptibility gradients in the direction of slice-selection, in data from gradient-echo and asymmetric spin-echo magnetic resonance techniques. Specifically an algorithm is used to determine the optimal parameters of a tailored radiofrequency pulse along with the accompanying slice-selection and slice-refocusing gradients to correct the signal dropout caused by linear susceptibility gradients in the direction of slice-selection.

The present invention comprises a computer implemented algorithm to determine the optimal degree of quadratic variation, a, induced by a tailored radiofrequency pulse in the phase, $\phi_{RF}$, of the transverse magnetisation in the direction of slice-selection as well as the parameters of the accompanying slice-selection and slice-refocusing gradients. The optimal degree of quadratic phase induced by the RF pulse, along with the parameters of the slice-selection and slice-refocusing gradient are found by maximising a cost function C which is a function of the intensity of the signal. One specific example cost function, $s_{min}$, is the minimum signal over the given range of magnetic susceptibility gradients. The cost function C is calculated for each degree of quadratic phase induced by the RF pulse, a, using Bloch simulation to determine the steady-state transverse magnetisation followed by numerical integration to determine the overall signal at each value of the susceptibility gradient.

One aspect of the present invention provides a method of calculating parameters to be used in an MR scan, comprising defining a cost function, C, in dependence at least on a determined range of magnetic susceptibility gradients, $G_{zs,min} < G_{zs} < G_{zs,max}$, of an object to be scanned, a quadratic phase variation, a, of a transverse magnetic field induced by an RF pulse, and a plurality of parameters defining a slice selection gradient, $G_z$, and a slice refocusing gradient, $G_{z,ref}$. The method also comprises determining a value of the quadratic phase variation, a, and values for the plurality of parameters defining the slice selection gradient, $G_z$, and the slice refocusing gradient, $G_{z,ref}$, such that the cost function, C, is maximised, wherein the determined values, when used as parameters of an MR scan, improve the detectability of an MR signal over the determined range of magnetic susceptibility gradients.

Preferably, the determined values reduce the signal drop-out in the MR scan, which is caused by the localised inhomogeneities that may result from magnetic susceptibility gradients at the boundaries within the object being imaged. The signal dropout is caused by dephasing of the transverse magnetisation by the susceptibility gradients, which the present invention seeks to address by optimising the degree of phase variation induced in the transverse magnetisation.

In one preferred embodiment of the present invention, the RF pulse may be a complex hyperbolic secant RF pulse that induces an approximately quadratic phase variation in the transverse magnetisation.

In another preferred embodiment, the cost function, C, is the minimum MR signal, $s_{min}$.

According to another embodiment, the cost function, C, is calculated for a value of the phase variation, a, using a Bloch simulation to determine the MR signal produced at a plurality of magnetic susceptibility gradient values over the determined range of magnetic susceptibility gradients.

Preferably, the Bloch simulation includes calculating the transverse magnetisation for the plurality of magnetic susceptibility gradient values over determined range of magnetic susceptibility gradients, wherein the transverse magnetisation may be calculated at the echo time, and at a plurality of spatial positions within the object.

In another preferred embodiment, the transverse magnetisation is numerically integrated to calculate the MR signal at the plurality of magnetic susceptibility gradient values, wherein the cost function, C, is determined from the MR signal over the determined range of magnetic susceptibility gradients.

According to one embodiment, the range of magnetic susceptibility gradients, $G_{zs,min} < G_{zs} < G_{zs,max}$, is determined by measuring the range of magnetic susceptibility gradients for the objects to be scanned. Preferably, the object to be scanned is a body part.

According to another embodiment, the range of magnetic susceptibility gradients, $G_{zs,min} < G_{zs} < G_{zs,max}$, is determined by measuring the range of magnetic susceptibility gradients for at least one object that is of the same class as the object to be scanned. Preferably, the object to be scanned is a body part.

In a preferred embodiment of the present invention, the RF pulse is defined in dependence of at least one or more of the bandwidth $\Delta f$, the peak amplitude $A_0$, the RF pulse duration $T_{RF}$, the sampling period $\Delta t_{RF}$, the flip angle $\alpha$, and the degree of quadratic phase variation induced in the transverse magnetisation, a.

In a further embodiment, the parameters of the slice-selection gradient include at least one or more of the peak amplitude of the slice-selection gradient $G_z$, the time duration of the slice-selection gradient ramp, $T_{ramp}$ and the time duration of the slice-selection gradient plateau, $T_{plateau}$.

In another embodiment, wherein the parameters of the slice-refocusing gradient include at least one or more of the area of the slice-refocusing gradient $A_{ref}$, the peak amplitude of slice-refocusing gradient $G_{z,ref}$, the time duration of the slice-refocusing gradient ramp, $T_{ramp,ref}$ and the time duration of the slice-refocusing gradient plateau, $T_{plateau,ref}$.

A second aspect of the present invention provides a method of performing an MR scan, comprising defining a cost function, C, in dependence at least on a determined range of magnetic susceptibility gradients, $G_{zs,min} < G_{zs} < G_{zs,max}$, of an object to be scanned, a quadratic phase variation, a, of a transverse magnetic field induced by an RF pulse, and a plurality of parameters defining a slice selection gradient, $G_z$, and a slice refocusing gradient, $G_{z,ref}$. The method further comprises determining a value of the quadratic phase variation, a, and values for the plurality of parameters defining the slice selection gradient, $G_z$, and the slice refocusing gradient, $G_{z,ref}$, such that the cost function, C, is maximised, and performing an MR scan using the determined values as parameters to improve the detectability of an MR signal over the determined range of magnetic susceptibility gradients.

A third aspect of the present invention provides an apparatus for calculating parameters to be used in an MR scan, comprising a processor, and a computer readable medium, the computer readable medium storing one or more instruction(s) arranged such that when executed the processor is caused to define a cost function, C, in dependence at least on a determined range of magnetic susceptibility gradients, $G_{zs,min} < G_{zs} < G_{zs,max}$, of an object to be scanned, a quadratic phase variation, a, of a transverse magnetic field induced by an RF pulse, and a plurality of parameters defining a slice selection gradient, $G_z$, and a slice refocusing gradient, $G_{z,ref}$. The processor is further caused to determine a value of the phase variation, a, and values for the plurality of parameters defining the slice selection gradient, $G_z$, and the slice refocusing gradient, $G_{z,ref}$, such that the cost function is maximised, wherein the determined values, when used as parameters of an MR scan, improve the detectability of an MR signal over the determined range of magnetic susceptibility gradients.

A fourth aspect of the present invention provides an MR scanner comprising a processor, the processor being arranged to define a cost function, C, wherein the cost function is defined in dependence at least on a determined range of magnetic susceptibility gradients, $G_{zs,min} < G_{zs} - G_{zs,min}$, of an object to be scanned, a quadratic phase variation, a, of a transverse, magnetic field induced by an RF pulse, and a plurality of parameters defining a slice selection gradient, $G_z$, and a slice refocusing gradient, $G_{z,ref}$. The processor is further caused to determine a value of the phase variation, a, and values for the plurality of parameters defining the slice selection gradient, $G_z$, and the slice refocusing gradient, $G_{z,ref}$, such that the cost function, C, is maximised, wherein the determined values, when used as parameters of an MR scan, improve the detectability of an MR signal over the determined range of magnetic susceptibility gradients.

BRIEF DESCRIPTION OF DRAWINGS

The present invention will now be described by way of example only, and with reference to the accompanying drawings in which.

DETAILED DESCRIPTION OF PREFERRED EMBODIMENTS

Overview

Figure 1:
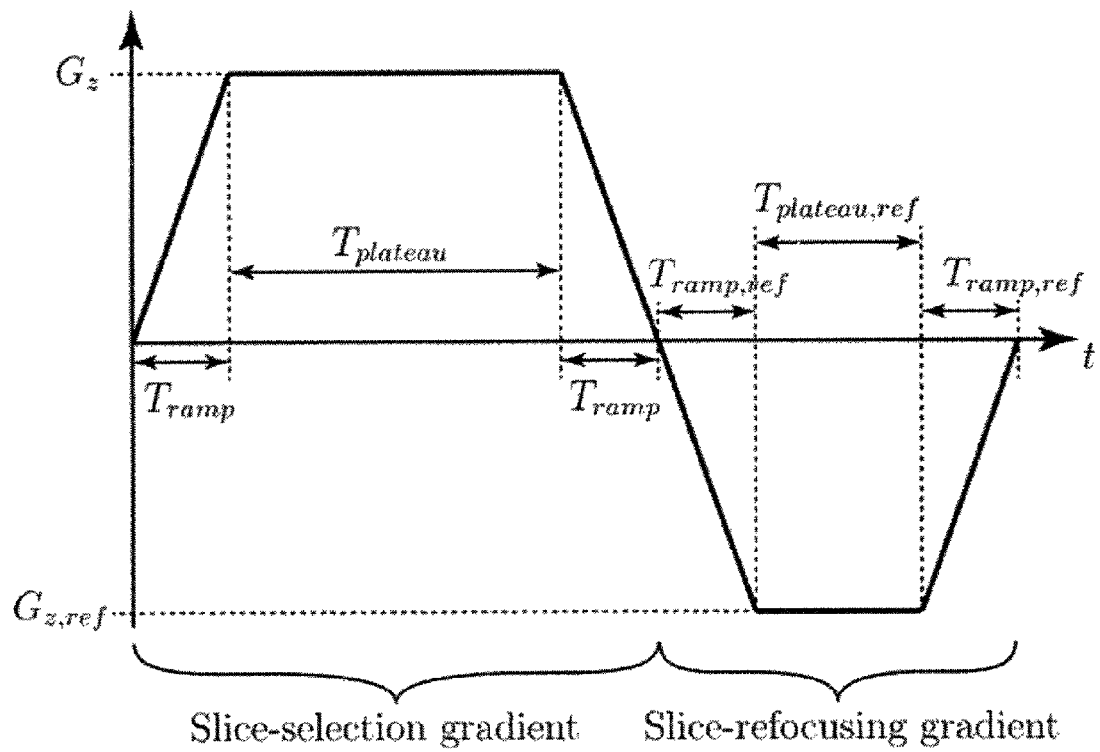
FIG. 1 is a schematic diagram showing the timings and amplitudes of the trapezoidal slice-selection and slice-refocussing gradients.

The present invention provides an algorithm that determines the optimal parameters of an RF pulse that is to be applied to the RF coil of an MRI or MRS scanner, wherein the RF pulse is optimised for a specific object upon which the MRI or MRS scan is to be performed. Additionally, in the process of finding the optimised parameters of the RF pulse, the algorithm also determines the slice selection and slice refocusing gradients that correspond to the parameters of the RF pulse and that are to be applied to the gradient coils of the MRI or MRS scanner. The main objective of this algorithm is to reduce the problem of signal dropout caused by varying linear susceptibility gradient which are present in objects. The algorithm is able to determine the optimal parameters of the RF pulse and the accompanying slice selection and slice refocusing gradients which will reduce signal dropout caused by the range of magnetic susceptibility gradient present in a specific object.

The algorithm defines a cost function, C, the value of which can be determined for the degree of phase variation in the transverse magnetic field induced by the RF pulse over a specific range of magnetic susceptibility gradients. The MR signal varies as a function of the phase variation and magnetic susceptibility gradient and, therefore, the cost function C is a function of the MR signal (for example the minimum signal, $s_{min}$) obtained over a range of magnetic susceptibility gradients for a certain value of phase variation. Any RF pulse may be used that induces a quadratic variation in the transverse magnetic field. For example, an RF pulse with a complex hyperbolic secant profile as described by equation (3) may be used, whereby the cost function C is determined in relation to $\mu$, which is proportional to the degree of quadratic phase variation, a. The range of magnetic susceptibility gradients for which the cost function C is calculated depends on those found in the specific object upon which the MRI or MRS scan will be performed.

Consider by way of example an MRI or MRS scan that is to be performed on a patient's head. The algorithm is performed to find the maximum possible cost function C over a range of values for the degree of quadratic phase variation, a, in order to determine the optimal RF pulse for capturing an image of at least part of the patient's head. That is to say, the value of the cost function is determined given a range of susceptibility gradients specific to the patient's head for a range of a values until the maximum value of the cost function $s_{min}$ is found. The range of magnetic susceptibility gradients used may have been measured directly from the patient's head or from one or more other patient's heads whereby the range of magnetic susceptibility gradients present are substantially similar.

For every value of a the algorithm determines the parameters of the slice-selection and slice-refocusing gradients that correspond to that value of a and the RF pulse it corresponds to. Once all of these parameters have been calculated, a Bloch simulation is run to estimate the signal, s, obtained from an MRI or MRS scan performed under these conditions. This simulation is repeated for incremental values over the range of magnetic susceptibility gradients to obtain a range of values for the signal, s, from which a cost function, C, is determined for that value of a, wherein the cost function, C, is a function of the MR signal. For example, the cost function, C, may be the minimum MR signal, $s_{min}$, obtained over a range of magnetic susceptibility gradients for a specific value of a. After a plurality of repetitions with different a values, the value of a that maximises the cost function C can be determined, and it is the RF pulse and slice-selection and slice-refocusing gradients corresponding to this value of a that are used to perform the MRI or MRS scan.

In summary, the present invention provides an algorithm that utilises the properties of the object to be imaged, the RF pulse and the MRI or MRS scanner to produce a tailored RF pulse that will acquire the maximum signal from the MRI or MRS scanner over a particular range of magnetic susceptibility gradients. That is, the present invention is able to design an RF pulse and the accompanying slice-selection and slice-refocusing gradients that are tailored to a specific object in order to improve the quality of the captured image.

Embodiments of the Present Invention

One embodiment of the present invention comprises a computer implemented algorithm to determine the optimal level of quadratic variation induced by a radiofrequency (RF) pulse in the phase of the transverse magnetisation in the direction of slice-selection as well as the parameters of the accompanying slice-selection and slice-refocusing gradients to reduce the problem of signal dropout caused by linear susceptibility gradients in the direction of slice-selection in gradient-echo magnetic resonance imaging. The computer implemented algorithm may be integrated into a computer system used to operate an MRI or MRS scanner, as illustrated by FIG. 10, and implemented as part of the scanning process, or, alternatively, the algorithm may be implemented separately by an external computer system and the resulting tailored RE pulse and the parameters of the accompanying slice-selection and slice-refocusing gradients manually input to the MRI or MRS scanner before a scan is performed.

Figure 10:
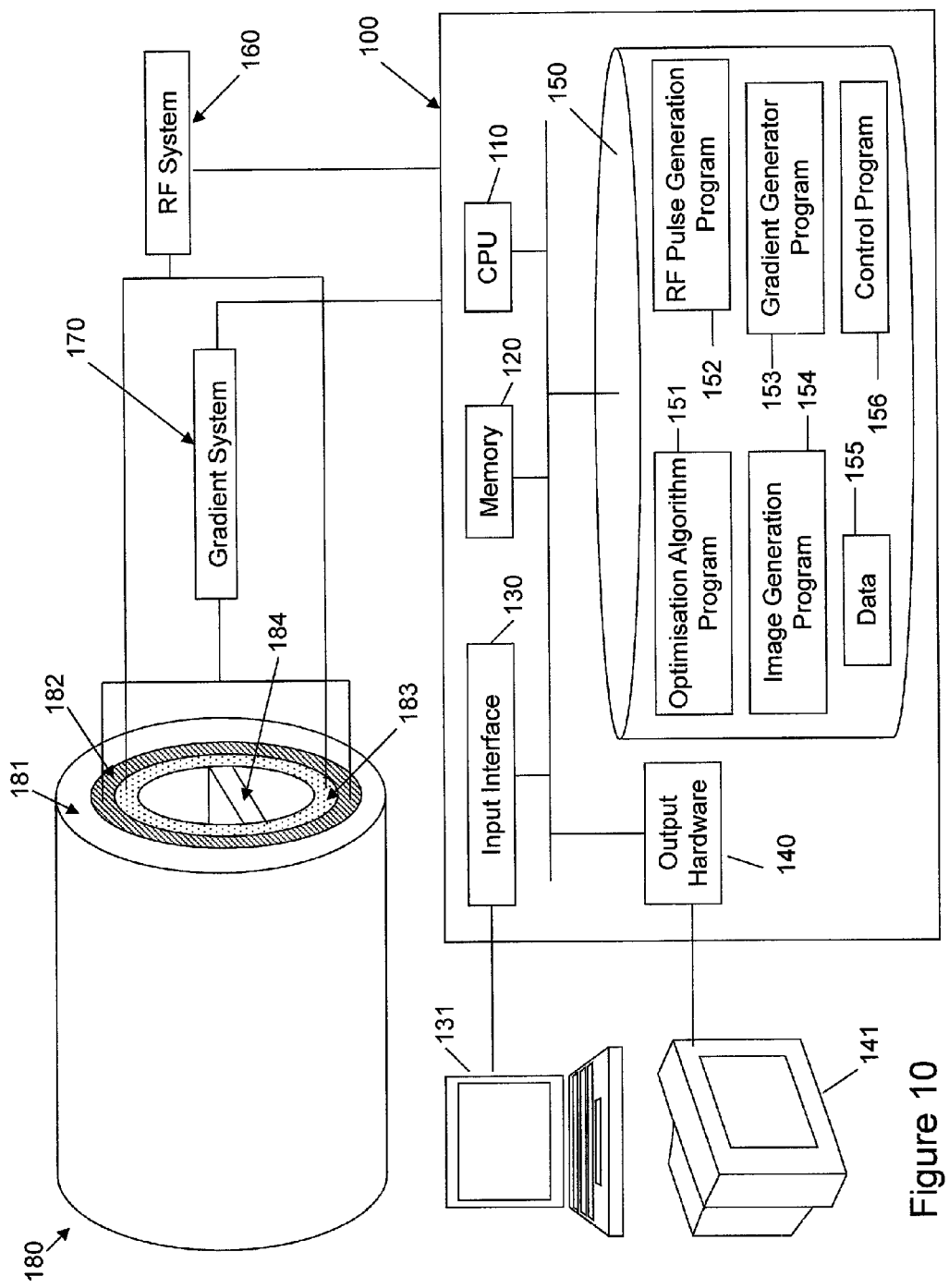
FIG. 10 is a block diagram illustrating apparatus according to one embodiment of the present invention.

FIG. 10 illustrates, by way of example, the system components that may form the platform for embodiments of the present invention. The computer system 100 comprises a central processing unit (CPU) 110, a working memory 120, input interface 130 arranged to receive control inputs from the user via an input device 131 such as a computer with a keyboard, mouse or other controller, and output hardware 140 arranged to provide output information to the user via a visual display unit 141 such as a computer, television or other visual display.

The computer system 100 may also be provided with a computer readable storage medium 150 such as a hard disk drive (HDD), flash drive, solid state drive, or any other form of general purpose data storage, upon which stored data 154 and various control programs are arranged to enable the system to operate according to embodiments of the present invention. For example, a control program 156 is provided and arranged to provide overall control of the system to perform the embodiments of the present invention. This control program 156 may, for example, receive user inputs and launch other programs to perform specific tasks. The other programs under the control of the control program 156 include an optimisation algorithm program 151, an RF pulse generation program 152, gradient generation program 153 and image generation program 154. These programs 151-154 will be discussed in more detail below.

The computer system 100 is connected to an MR scanner 180 comprising a magnet 181, a set of gradient coils 182, a patient table 184, and a set of RF coils 183. The RF coils 183 may comprise a large body coil arranged to transmit and receive an RF signal, and a set of specialised RF coils that are used for specific purposes. For example, different specialised RF coils may be used to receive an RF signal to image specific parts of a human body. The gradient coils 182 are connected to a gradient system 170 which receives inputs from the gradient generation program 153 to produce the magnetic field gradients of the gradient coils 182. The body coil of the RF coils 183 may be connected to an RF system 160 which receives inputs from the RF pulse generation program 152 to transmit an RF pulse to the RF coils 183. The MR scanner 180 then scans an object on the patient table 184 and a signal from the set of RF receive coils or the body coil of the RF coils 183 is transmitted back through the RF system 160 to the computer system 100. The RF system 160 and gradient system 170 may both include an amplifier. Once a signal has been transmitted back to the computer system 100, the control program 156 launches the image generation program 154, which may include an array processor and image processor, to analyse the signal and transform it into a magnetic resonance image or spectrum of the scanned object to be displayed on the visual display device 141.

It should be appreciated that various other components and systems would of course be known to the person skilled in the art to permit the MR system to operate.

Before an object is scanned by the MR scanner 180, the optimisation algorithm program 151 is launched in order to perform an algorithm, as described in detail below, that will produce a tailored RF pulse and determine the parameters of the magnetic field gradient such that signal dropout caused by magnetic susceptibility gradients in the direction of slice-selection is reduced. Once the optimisation algorithm program 151 has run, the parameters of the tailored RF pulse and the magnetic field gradient will be provided to the RF pulse generation program 152 and gradient generation program 153 and the MRI or MRS scan may then be performed.

Figure 8:
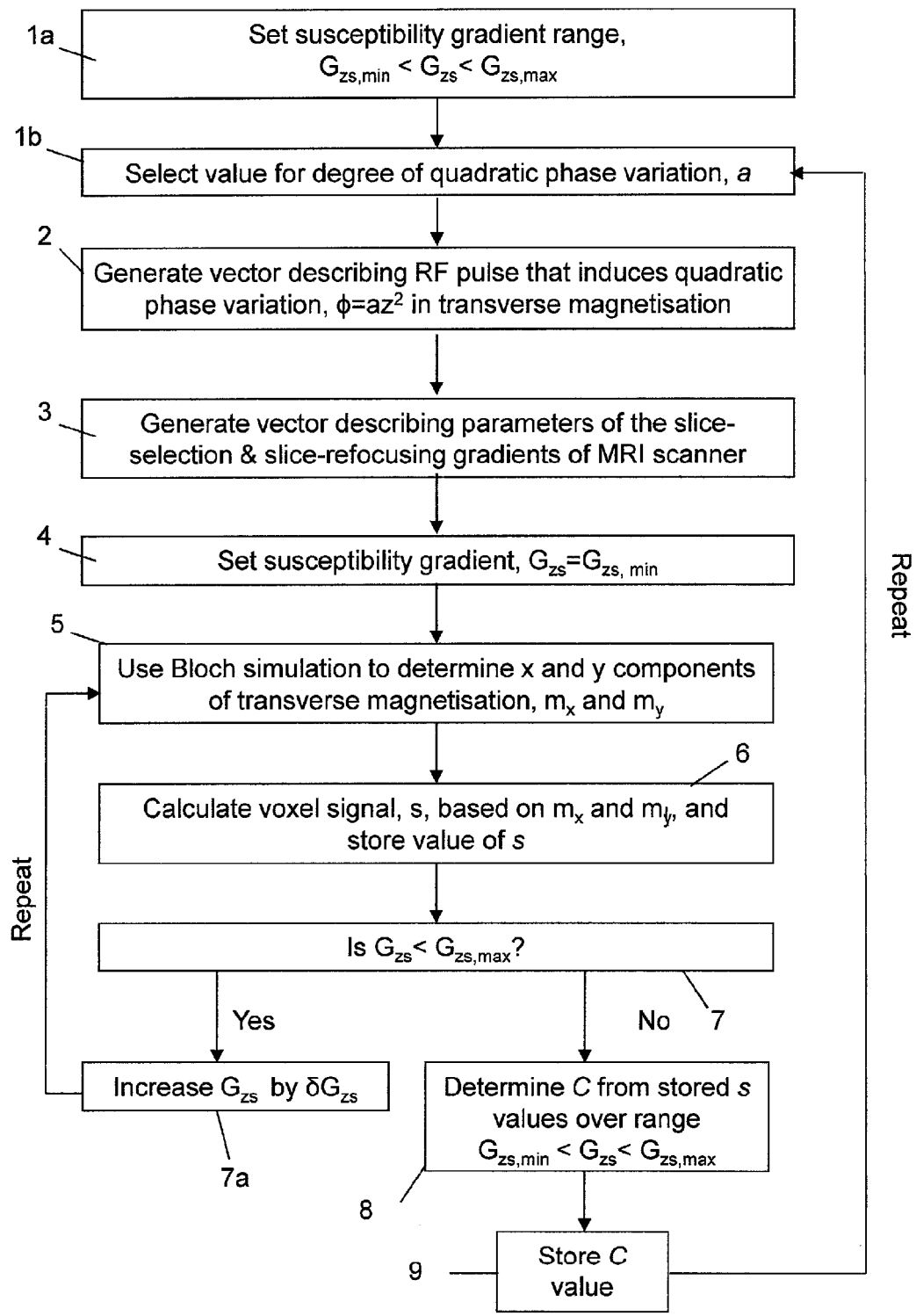
FIG. 8 is a flow diagram illustrating an algorithm implemented to maximise the cost function, C, according to one embodiment of the present invention.

The algorithm performed by the optimisation algorithm program 151 may be used to determine the optimum degree of quadratic phase variation, a, as illustrated by FIG. 8. The parameters of the trapezoidal slice-selection gradient determined by the algorithm are the gradient amplitude, $G_z$, the duration of the gradient ramps, $T_{ramp}$, and the duration of the gradient plateau, $T_{plateau}$. Finally the parameters of the trapezoidal or triangular slice-refocusing gradient determined by the algorithm are; the gradient amplitude, $G_{z,ref}$ the duration of the gradient ramps, $T_{ramp,ref}$ and the duration of the gradient plateau, $T_{plateau,ref}$.

This embodiment of the algorithm requires, as inputs, the following properties about the object being scanned: the longitudinal relaxation time, $T_1$, the transverse relaxation time, $T_2$, and the range of magnetic susceptibility gradients in the direction of slice selection, $G_{zs,min} < G_{zs} < G_{zs,max}$, over which the signal dropout is to be reduced. Additionally it requires the following properties of the scanner hardware: the maximum gradient amplitude in the direction of slice selection, $G_{z,max}$, the maximum gradient slew rate, SR, the maximum radiofrequency amplitude, $B_{1,max}$ and the maximum radiofrequency pulse duration, $T_{RF,max}$. It also requires, the parameters of the pulse sequence that will be used to acquire the MR data: the repetition time, TR, the echo time, TE and the slice thickness, $\Delta z$. The RF pulse duration, $T_{RF}$, and the desired sampling periods of the radiofrequency amplifier(s) ($\Delta t_{RF}$) and gradient amplifiers ($\Delta t_G$) must also be specified. The flip angle, $\alpha$, of the RF pulse can be specified; if not, the Ernst angle [6], $\alpha_E$, given by equation 4, is used because this maximises the steady-state signal at the echo time.

$$\alpha_E = \cos^{-1}\left(e^{-\frac{TR}{T_1}}\right) \quad (4)$$

The optimal degree of quadratic phase variation, $a_{optimal}$, is found by maximising the cost function C, wherein C can be determined for a given value of a using the steps outlined below. The steps outlined below are repeated for a plurality of a values for the same range of magnetic susceptibility gradients, $G_{zs,min} < G_{zs} < G_{zs,max}$, until a maximum value of the cost function C is determined. The a value corresponding to the maximum cost function C is the optimal degree of quadratic phase variation, $a_{optimal}$ to be used. For an RF pulse with $a_{optimal}$ and bandwidth, $\Delta f$, the values of $G_z$, $T_{ramp}$, $T_{plateau}$ are determined using equations 5, 6 and 7 respectively; and the values of $G_{z,ref}$, $T_{ramp,ref}$, $T_{plateau,ref}$ are determined using steps 3.d. and 3.e. as described below.

The steps to determine C are:
1. Set the range of susceptibility gradients (1a), $G_{zs,min} < G_{zs} < G_{zs,max}$, for which C is to be determined, and select a value for a (1b).
2. Generate a vector containing the amplitude of the real and imaginary parts of an RF pulse which is known to induce a quadratic phase variation, $\phi_{RF} = az^2$, in the transverse magnetisation (2). The RF pulse should be sampled every $\Delta t_{RF}$, have duration, $T_{RF}$, have a flip angle, $\alpha$, peak amplitude less than $B_{1,max}$ and frequency bandwidth, $\Delta f$, less than $$\frac{\gamma \Delta z G_{z,max}}{2\pi}.$$

3. Generate a vector containing the amplitude of the slice-selection and slice-refocusing gradient, as shown schematically in FIG. 1 (3). The amplitude should be sampled every $\Delta t_G$.
   a. For a given slice thickness, $\Delta z$, and RF pulse bandwidth, $\Delta f$, the amplitude, $G_z$, of the trapezoidal slice-selection gradient is calculated, using the well-known relationship given in equation 5[7]:

$$G_z = \frac{2\pi \Delta f}{\gamma \Delta z} \quad (5)$$

b. For a given maximum gradient slew rate, SR, the duration of the ramps, $T_{ramp}$ of the trapezoidal slice-selection gradient, is calculated using the well-known relationship given in equation 6[7]:

$$T_{ramp} = \frac{G_Z}{SR} \quad (6)$$

c. As is commonly the case, the duration of the gradient plateau, $T_{plateau}$, is set to match the duration of the RF pulse, i.e.:

$$T_{plateau} = T_{RF} \quad (7)$$

d. The area of the slice-refocusing gradient, $A_{ref}$, is set using equation 8 to ensure that the dephasing caused by both the slice-selection gradient and the mean susceptibility gradient, $G_{zs,mean}$ is cancelled out.

$$A_{ref} = -G_2\left(T_{isodelay} + \frac{T_{ramp}}{2}\right) - G_{zs,mean}TE \quad (8)$$

Here $T_{isodelay}$ is the isodelay of the RF pulse.
   e. As described previously [7] if $$|A_{ref}| < \frac{G_{z,max}^2}{SR}$$

the slice-refocusing gradient is triangular with peak amplitude, $G_{z,ref}$ and ramp durations, $T_{max,ref}$ calculated using the well-known relationships given in equations 9 and 10 respectively.

$$G_{z,ref} = A_{ref}\sqrt{\frac{SR}{|A_{ref}|}} \quad (9)$$

$$T_{ramp,ref} = \sqrt{\frac{|A_{ref}|}{SR}} \quad (10)$$

If however $$|A_{ref}| \geq \frac{G_{z,max}^2}{SR},$$

the slice-refocusing gradient is trapezoidal. The amplitude, $G_{z,ref}$, ramp durations, $T_{ramp,ref}$, and plateau durations, $T_{plateau,ref}$ are calculated using the well-known relationships given in equations 11, 12 and 13 respectively.

$$G_{z,ref} = \text{sign}(A_{ref})G_{z,max} \quad (11)$$

$$T_{ramp,ref} = \sqrt{\frac{G_{z,max}}{SR}} \quad (12)$$

$$T_{plateau,ref} = \frac{|A_{ref}|}{G_{z,max}} - T_{ramp,ref} \quad (13)$$

4. Set the susceptibility gradient to $G_{zs}=G_{zs,min}$ (4).
5. Use Bloch simulation (5) to determine the steady-state values of the x and y components of the transverse magnetisation, $m_x$ and $m_y$, at the echo time at $N_z$ spatial positions (in the range $-\Delta z \leq z \leq \Delta z$), given the RF pulse, slice-selection gradient, slice-refocusing gradient, susceptibility gradient, $G_{zs}$, $T_1$ and $T_2$. In this embodiment of the algorithm Bloch simulation is performed using the method described in B. A. Hargreaves, C. H. Cunningham, D. G. Nishimura, and S. M. Conolly, "Variable-Rate Selective Excitation for Rapid MRI Sequences", *Magnetic Resonance in Medicine,* 52, 590-597, 2004 [8].
6. Calculate (and store) the voxel signal, s, by numerical integration of $m_x$ and $m_y$, as shown in equation 14 (6).

$$s = \sqrt{[\int_{-\Delta z}^{\Delta z} m_x(z)dz]^2 + [\int_{-\Delta z}^{\Delta z} m_y(z)dz]^2} \quad (14)$$

7. If $G_{zs}<G_{zs,max}$ (7) then increase $G_{zs}$ by $$\delta G_{zs} = \frac{G_{zs,max} - G_{zs,min}}{N_{G_{zs}}}$$

(7a) and go back to step 4, otherwise proceed to step 8.
8. At this value of a calculate the cost function (8), C from the values of the voxel signal for susceptibility gradients in the range $G_{zs,min}<G_{zs}<G_{zs,max}$ stored at step 5.
9. Store the calculated C value (9), return to step 1 (1b) and repeat the algorithm for a new value of a.

Once this has been repeated for a plurality of a values, the maximum value of the cost function C can be determined from the stored C values (9). The parameters corresponding to the maximum C value, that is the parameters of the RF value and the slice-selection and slice-refocusing gradients used in the above steps to obtain the maximum C value, are then used to perform an MRI or MRS scan.

Figure 9:
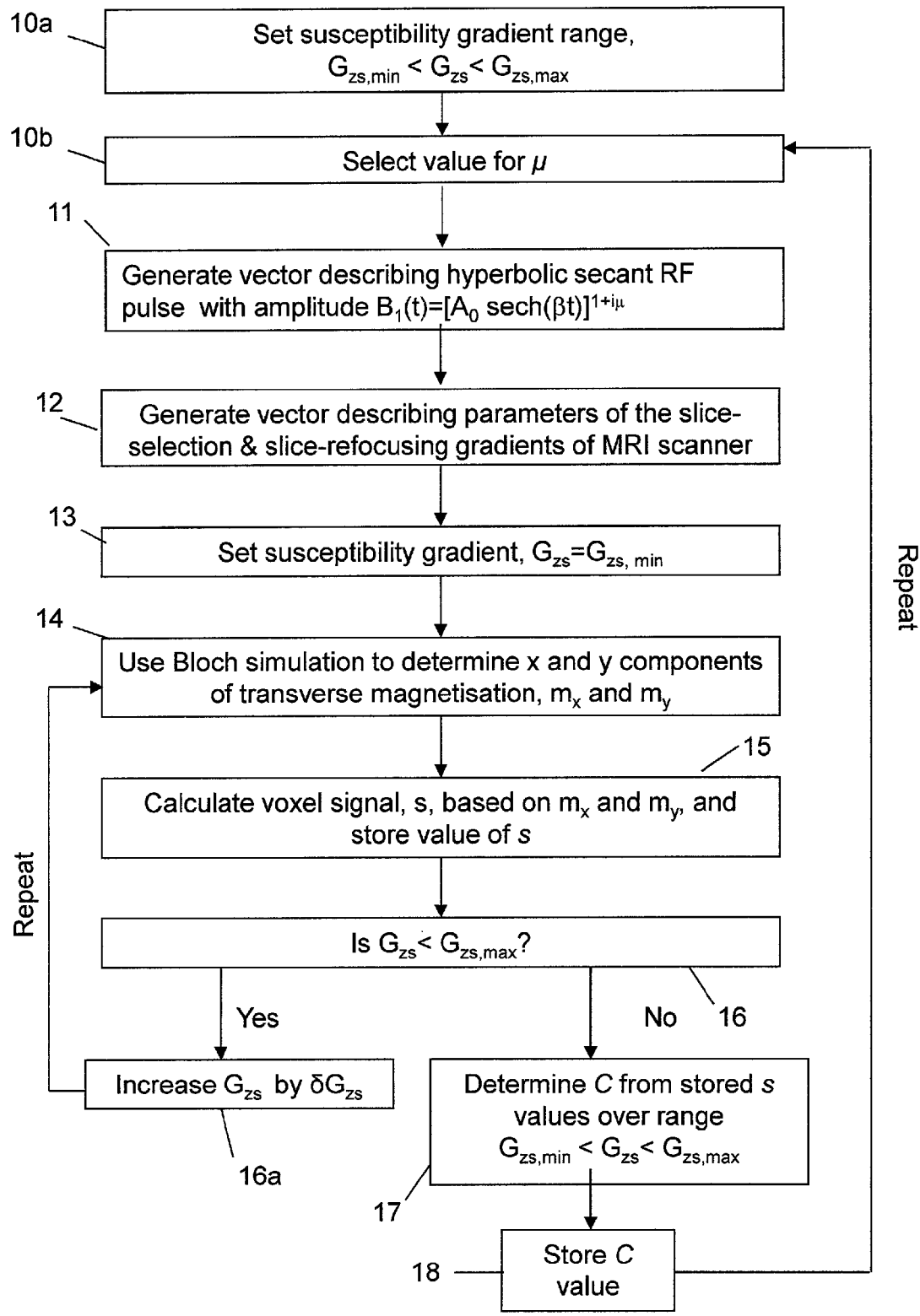
FIG. 9 is a flow diagram illustrating an algorithm implemented to maximise the cost function, C, according to an example of one embodiment of the present invention.

An example of one embodiment of the present invention, as illustrated by FIG. 9, gives a computer implemented algorithm which may be performed by the optimisation algorithm program 151 shown in FIG. 10 to determine the parameters of a complex hyperbolic secant RF pulse, given by equation 3, along with the parameters of the accompanying slice-selection and slice-refocusing gradients. As described above, this algorithm is performed with the objective of reducing the problem of signal dropout caused by magnetic susceptibility gradients in the direction of slice selection in magnetic resonance imaging.

The parameters of the complex hyperbolic secant RF pulse determined by the algorithm are: the degree of quadratic phase variation, $\mu$; the modulation angular frequency, $\beta$; the flip angle, $\alpha$; the peak amplitude, $A_0$; and the frequency bandwidth, $\Delta f$. The parameters of the trapezoidal slice-selection gradient determined by the algorithm are: the gradient amplitude, $G_z$, the duration of the gradient ramps, $T_{ramp}$, and the duration of the gradient plateau, $T_{plateau}$. Finally the parameters of the trapezoidal or triangular slice-refocusing gradient determined by the algorithm are: the gradient amplitude, $G_{z,ref}$, the duration of the gradient ramps, $T_{ramp,ref}$, and the duration of the gradient plateau, $T_{plateau,ref}$.

This embodiment of the algorithm requires, as inputs, the following properties about the object being imaged: the longitudinal relaxation time, $T_1$, the transverse relaxation time, $T_2$, and the range of magnetic susceptibility gradients in the direction of slice selection, $G_{zs,min}<G_{zs}<G_{zs,max}$, over which the signal dropout is to be reduced. Additionally it requires the following properties of the scanner hardware: the maximum gradient amplitude in the direction of slice selection, $G_{z,max}$, the maximum gradient slew rate, SR, the maximum radiofrequency amplitude, $B_{1,max}$, the maximum radiofrequency pulse duration, $T_{RF,max}$. It also requires, the parameters of the pulse sequence that will be used to acquire the MR data: the repetition time, TR, the echo time, TE, the slice thickness, $\Delta z$. The RF pulse duration, $T_{RF}$, and the desired sampling periods of the radiofrequency amplifier ($\Delta t_{RF}$) and gradient amplifiers ($\Delta t_G$) must also be specified. The flip angle, $\alpha$, of the RF pulse can be specified; if not the Ernst angle, $\alpha_E$, given by equation 3, is used.

In this example, the optimal degree of quadratic phase variation, $\mu_{optimal}$, is found by maximising the cost function C, where C is determined using the following steps as outlined below. The steps outlined below are repeated for a plurality of $\mu$ values for the same range of magnetic susceptibility gradients, $G_{zs,min}<G_{zs}<G_{zs,max}$, until a maximum cost function C is determined.

The $\mu$ value corresponding to the maximum value of the cost function C is the optimal degree of quadratic phase variation, $\mu_{optimal}$, to be used. Given $\mu_{optimal}$, the value of $\beta$ is determined using step 2. b below; the value of $A_0$ is determined using equation 17; the value $\Delta f$ is determined using equation 18, the values of $G_z$, $T_{ramp}$, $T_{plateau}$ are determined using equations 5, 6 and 7 respectively; and the values of $G_{z,ref}$, $T_{ramp,ref}$, $T_{plateau,ref}$ are determined using steps 3.d and 3.e as described below.

The steps to determine C are:
1. Set the range of susceptibility gradients (10a), $G_{zs,min}<G<G_{zs,max}$, for which C is to be determined, and select a value for $\mu$ (10b).
2. Generate a vector containing the amplitude of the real and imaginary parts of the hyperbolic secant RF pulse given by equation 3 (11). The RF pulse should be sampled every $\Delta t_{RF}$ with duration, $T_{RF}$, flip angle, $\alpha$.

a. Set the value of β to its maximum value to minimise the stop-band ripple in the slice profile. The value of β is limited by both $B_{1,max}$ and $G_{z,max}$, so it is set to the smallest of:

$$\frac{\gamma B_{1,max}}{\sqrt{\left(\frac{\cos^{-1}\left(\cos(\alpha)\cosh^2\left(\frac{\pi\mu}{2}\right)+\sinh^2\left(\frac{\pi\mu}{2}\right)\right)}{\pi}\right)^2 + \mu^2}} \text{ or:} \quad (15)$$

$$\frac{\pi\gamma\Delta z G_{z,max}}{2\cosh^{-1}\left(\frac{\cosh(\pi\mu)\left(\cos(\alpha)-\frac{1}{2}\sqrt{3+\cos^2(\alpha)}\right)+\cos(\alpha)-1}{\frac{1}{2}\sqrt{3+\cos^2(\alpha)}-1}\right)} \quad (16)$$

b. Set the peak amplitude of the RF pulse, $A_0$, using equation 17.

$$A_0 = \frac{\beta}{\gamma}\sqrt{\left(\frac{\cos^{-1}\left(\cos(\alpha)\cosh^2\left(\frac{\pi\mu}{2}\right)+\sinh^2\left(\frac{\pi\mu}{2}\right)\right)}{\pi}\right)^2 + \mu^2} \quad (17)$$

c. Calculate the frequency bandwidth of the RF pulse, Δf, using equation 18.

$$\Delta f = \frac{\beta}{\pi^2}\cosh^{-1}\left(\frac{\cosh(\pi\mu)\left(\cos(\alpha)-\frac{1}{2}\sqrt{3+\cos^2(\alpha)}\right)+\cos(\alpha)-1}{\frac{1}{2}\sqrt{3+\cos^2(\alpha)}-1}\right) \quad (18)$$

3. Generate a vector containing the amplitude of the slice-selection and slice-refocusing gradient (12). The amplitude should be sampled every $\Delta t_G$.
   a. Set the amplitude of the trapezoidal slice-selection gradient, $G_z$, using equation 5.
   b. Set the duration of the ramps, $T_{ramp}$ of trapezoidal slice-selection gradient using equation 6.
   c. Set the plateau duration, $T_{plateau}$, of the trapezoidal slice-selection gradient using equation 7.
   d. Set the area of the slice-refocusing gradient, $A_{ref}$, using equation 8. The $T_{isodelay}$ for a hyperbolic secant pulse is $$\frac{T_{RF}}{2}.$$

e. If $$|A_{ref}| < \frac{G_{z,max}^2}{SR}$$

the slice-refocusing gradient is triangular and the peak amplitude, $G_{z,ref}$ and ramp durations, $T_{ramp,ref}$ are calculated using equations 9 and 10 respectively. If $$|A_{ref}| \geq \frac{G_{z,max}^2}{SR},$$

the slice-refocusing gradient is trapezoidal and the peak amplitude, $G_{z,ref}$, ramp durations, $T_{ramp,ref}$ and plateau duration, $T_{plateau,ref}$ are calculated using equations 11, 12 and 13 respectively.

4. Set the susceptibility gradient to $G_{zs}=G_{zs,min}$ (13).
5. Use Bloch simulation (14) to determine the steady-state values of the x and y components of the transverse magnetisation, $m_x$ and $m_y$, at the echo time at $N_z$ spatial positions (equally spaced in the range $-\Delta z < z < \Delta z$), given the RF pulse, slice-selection gradient, slice-refocusing gradient, susceptibility gradient, $G_{zs}$, $T_1$ and $T_2$. In this embodiment Bloch simulation is performed using the method described in B. A. Hargreaves, C. H. Cunningham, D. G. Nishimura, and S. M. Conolly, "Variable-Rate Selective Excitation for Rapid MRI Sequences", *Magnetic Resonance in Medicine*, 52, 590-597, 2004 [8]. In this embodiment the number of spatial positions, $N_z$, at which $m_x$ and $m_y$ are calculated is set to 101.
6. Calculate (and store) the voxel signal (15), s, by numerical integration of $m_x$ and $m_y$, as shown in equation 14.
7. If $G_{zs} < G_{zs,max}$ (16) then increase $G_{zs}$ by $$\delta G_{zs} = \frac{G_{zs,max} - G_{zs,min}}{N_{G_{zs}}}$$

(16a) and go back to step 4 (13), otherwise proceed to step 8 (17). In this embodiment the number of different susceptibility gradients at which the voxel signal is determined, $N_{G_{zs}}$, is set to 51.

8. At this value of μ calculate the minimum voxel signal, C, from the stored values of the voxel signal for the susceptibility gradients in the range $G_{zs,min} < G_{zs} < G_{zs,max}$ (17).
9. Store the calculated C value (18), return to step 1 (10b) and repeat the algorithm for a new value of μ.

Once this has been repeated for a plurality of μ values, the maximum value of the cost function C can be determined from the stored C values (18). The parameters corresponding to the maximum C value, that is the parameters of the hyperbolic secant RF pulse and the slice-selection and slice-refocusing gradients used in the above steps to obtain the maximum C value, are then used to perform an MRI or MRS scan.

As an exemplar of the present invention, a hyperbolic secant pulse ($T_{RF}=5$ ms) is designed to reduce signal drop-out in grey matter ($T_1=1.6$ s, $T_2=66$ ms, $G_{zs,min}=-350$ μTm$^{-1}$ and $G_{zs,max}=350$ μTm$^{-1}$) in images of the human head acquired using a gradient-echo echo-planar imaging pulse sequence (TE=30 ms, TR=2 s and Δz=3 mm) with an MR scanner with a static magnetic field strength, $B_0$, of 3 T, $G_{z,max}=40$ mTm$^{-1}$, SR=200 Tm$^{-1}$ s$^{-1}$, $B_{1,max}=20$ μT, $T_{RF,max}=20$ ms, $\Delta t_{RF}=2$ μs and $\Delta t_G=4$ μs.

Figure 2:
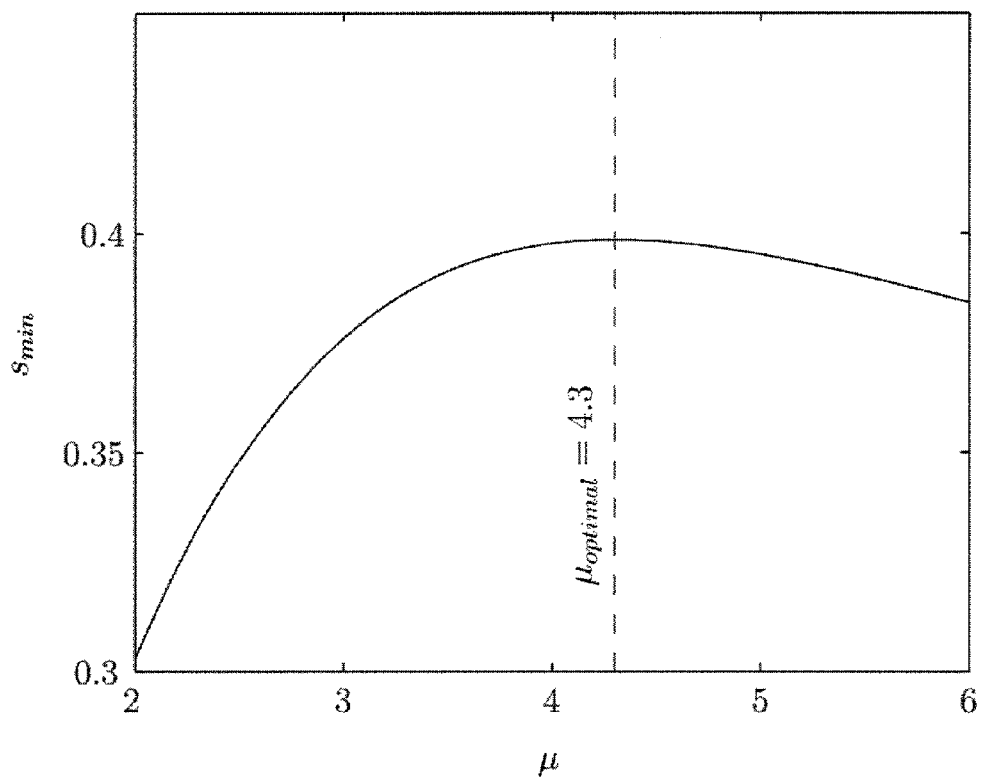
FIG. 2 is a graph showing the value of the cost function $s_{min}$ for a hyperbolic secant pulse as a function of $\mu$.

The flip angle is set to α=73°, the Ernst angle for this TR and $T_1$, using equation 4. As shown in FIG. 2 the optimal value of μ which maximises the value of the cost function $s_{min}$ (the minimum signal over the given range of magnetic susceptibility gradients), is μ=4.3.

Given this value μ the value of β is determined using step 1. b. in the above algorithm; the value of $A_0$ is determined using equation 17; the value Δf is determined using equation 18, the values of $G_z$, $T_{ramp}$, $T_{plateau}$ are determined using equations 5, 6 and 7 respectively; and the values of $G_{z,ref}$, $T_{ramp,ref}$, $T_{plateau,ref}$ are determined using steps 2.d. and 2.e. above.

Figure 3:
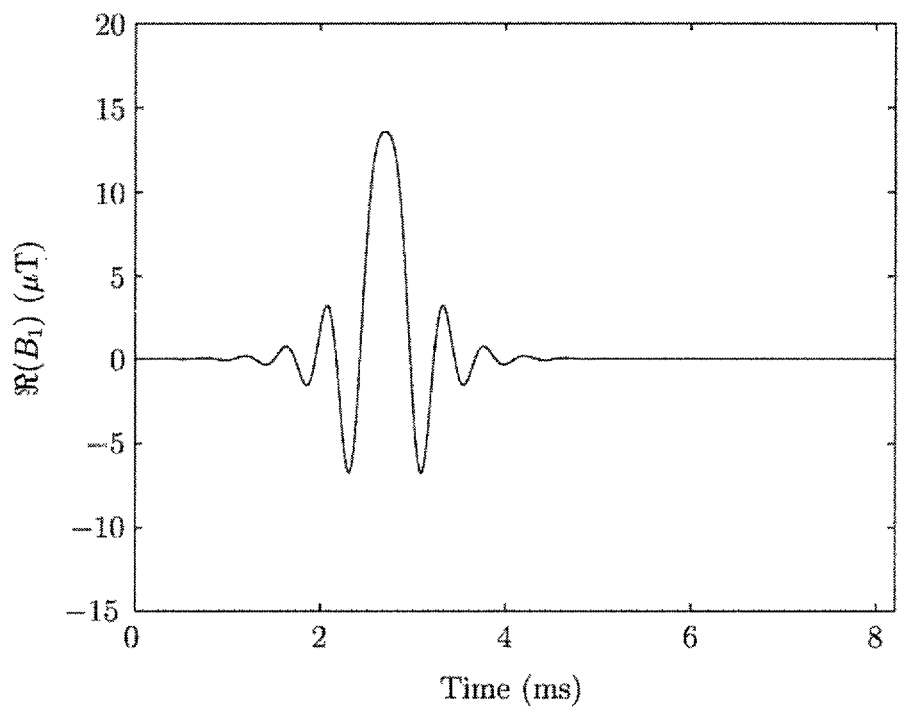
FIG. 3 is a graph showing the real part of the exemplar optimised complex hyperbolic secant radiofrequency pulse as a function of time.
Figure 4:
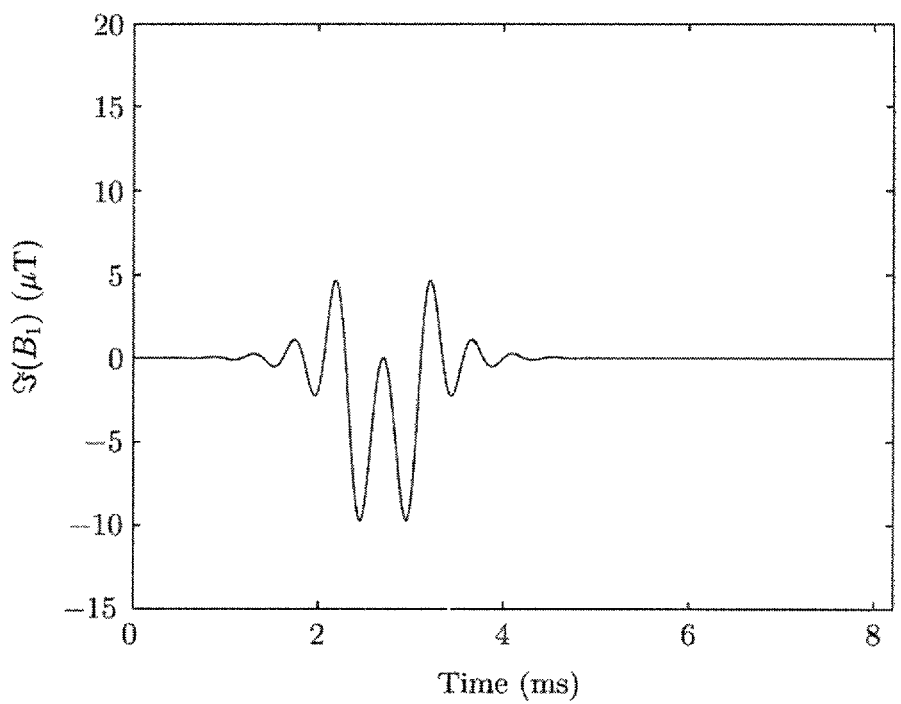
FIG. 4 is a graph showing the imaginary part of the exemplar optimised complex hyperbolic secant radiofrequency pulse as a function of time.
Figure 5:
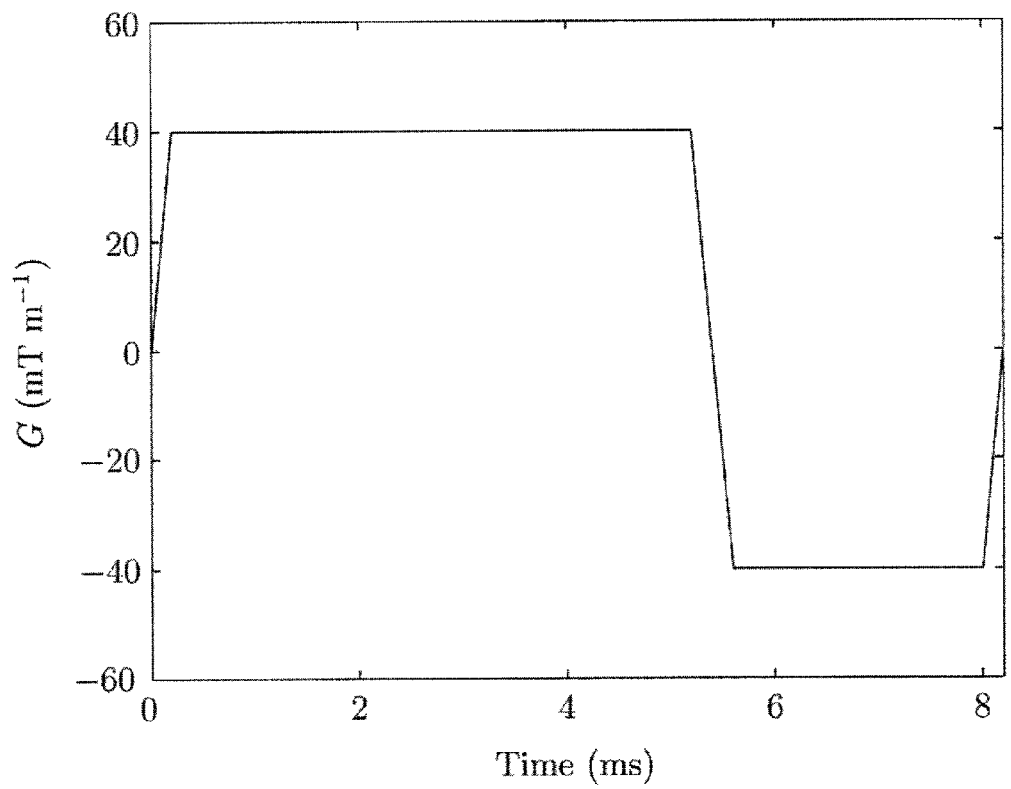
FIG. 5 is a graph showing the exemplar optimised slice-selection and slice-refocusing gradients as a function of time.
Figure 6:
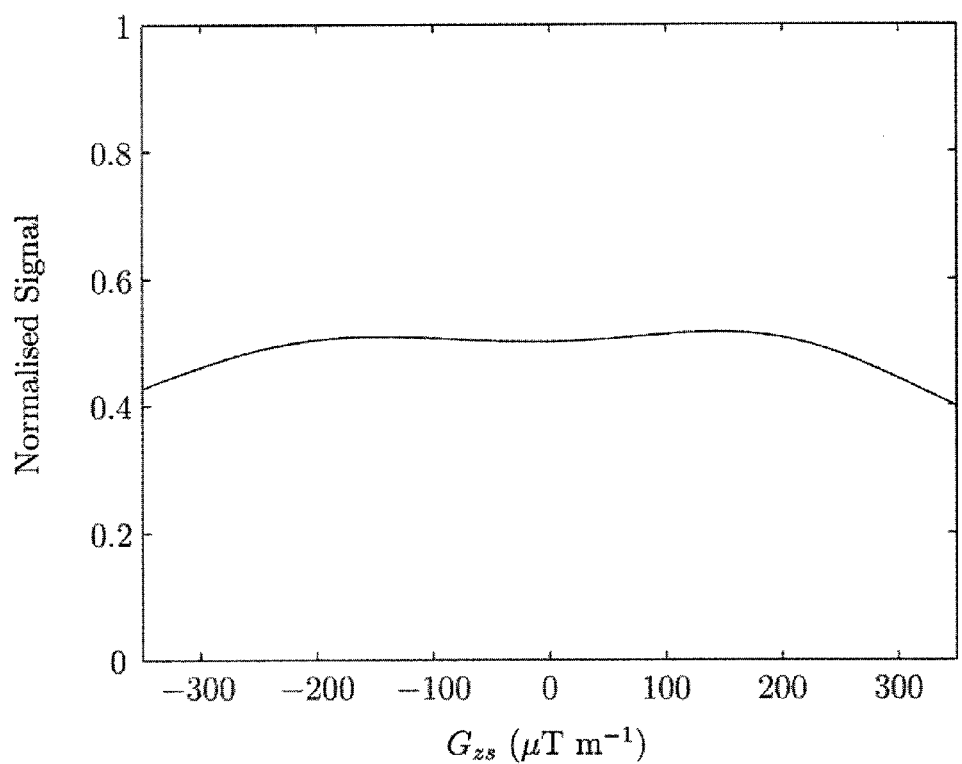
FIG. 6 is a graph of the normalised steady-state signal resulting from the exemplar optimised hyperbolic secant pulse, slice-selection and slice-refocussing gradients as a function of susceptibility gradient in the slice-selection direction.
Figure 7:
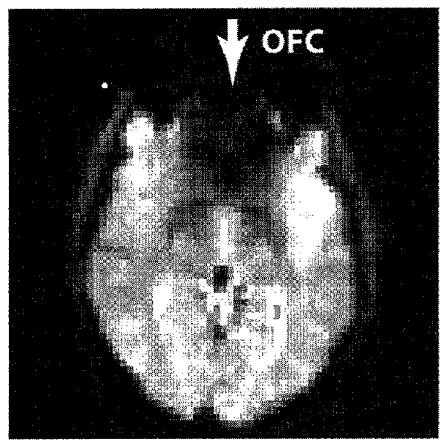
FIG. 7 is a comparison of a gradient-echo echo-planar image created using one particular embodiment the invention and a conventional gradient-echo echo-planar image.
Figure 7:
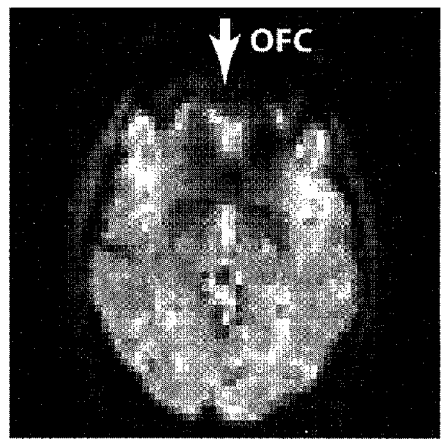
Figure 7:
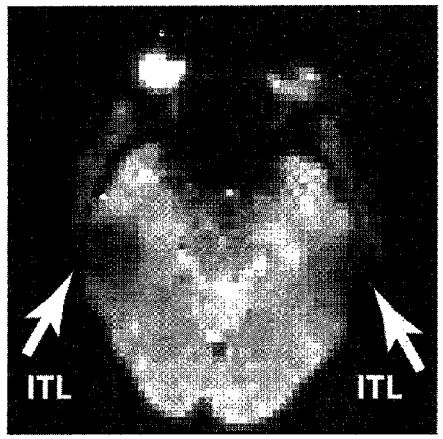
Figure 7:
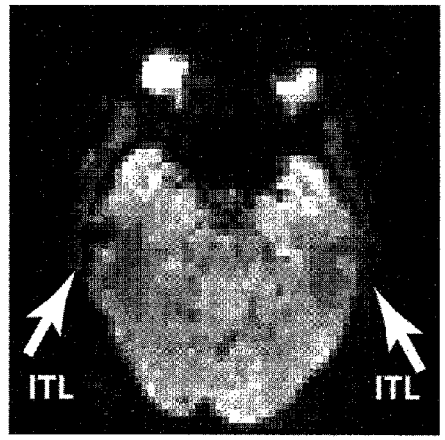

The result of the optimisation procedure is a hyperbolic secant RF pulse with: μ=4.3, β=3343 Hz, $A_0$=13.6 μT, $\Delta f=5109$ Hz, $\alpha=73.3°$; a trapezoidal slice-selection gradient with: $G_z=40$ mTm$^{-1}$, $T_{ramp}=200$ µs, $T_{plateau}=5$ ms and a trapezoidal slice-refocusing gradient with $A_{ref}=0.104$ smTm$^{-1}$, $T_{ramp,ref}=200$ µs and $T_{plateau,ref}=2.46$ ms. The real part of the optimised complex hyperbolic secant radiofrequency pulse as a function of time is shown in FIG. 3. The imaginary part of the optimised complex hyperbolic secant radiofrequency pulse as a function of time is shown in FIG. 4. The slice-selection and slice-refocusing gradients are shown as a function of time in FIG. 5. The normalised signal as a function of susceptibility gradient in the slice-selection direction is shown in FIG. 6. FIG. 6 demonstrates that signal is present across the specified range of susceptibility gradients. As highlighted in FIG. 7 there is clear evidence of signal recovery is seen in both the orbitofrontal (OFC) and inferior temporal (ITL) regions of the brain when the optimised RF pulse and accompanying gradients are used.

As described in the above description, the parameters of the tailored RF pulse and the accompanying slice-selection and slice-refocusing gradients determined by the computer implented algorithm of the present invention are dependent on a number of variable parameters, such that the output of the algorithm is subject to change if any one of the input parameters is varied. For example, changes in the relaxation times $T_1$, $T_2$ of an object to be scanned, the maximum RF amplitude, $B_{1,max}$, and maximum pulse duration, $T_{RF,max}$, of an MR scanner, and the repetition time, TR, echo time, TE, and slice thickness, $\Delta z$, of a pulse sequence used to acquire the MRI data will all result in a different value of the cost function, C, being calculated by the algorithm. Therefore, if any of the operational parameters change, the computer system 100 used to implement the algorithm will automatically re-run the algorithm in order to calculate the new maximised cost function corresponding to the modified parameters, and thus determine a new set of optimised parameters for the tailored RF pulse sequence and the accompanying slice-selection and slice-refocusing gradients.

The computer implemented algorithm of the present invention, as described above, designs tailored RF pulses and determines the parameters of the accompanying slice-selection and slice-refocusing gradients for specific ranges of magnetic susceptibility gradients, $G_{zs,min}<G_{zs}<G_{zs,max}$, in order to reduce signal dropout. Magnetic susceptibility is a property of matter that varies for different materials. The differences in magnetic susceptibility between different materials within objects can lead to local inhomogeneities in the magnetic field which can cause signal dropout in MRI or MRS. For example, in the human body such inhomogeneities can occur at and near the boundaries between bone, soft-tissue and air; they may also occur near metal implants.

Therefore, it may be necessary to implement the algorithm of the present invention for every object that is to be scanned by inputting the range of magnetic susceptibility gradient corresponding to each scanned object. The magnetic susceptibility gradient range, $G_{zs,min}<G_{zs}<G_{zs,max}$, of an object may be measured by a number of known techniques, and subsequently input to the computer implemented algorithm. This process may be performed for every scanned object, for example, when scanning a patient the magnetic susceptibility gradient range may be measured for different body parts. However, magnetic susceptibility gradient ranges for specific objects are generally similar universally. For example, the magnetic susceptibility gradient range in the human head will be substantially similar for all patients, and therefore the same magnetic susceptibility gradient range may be used in the present invention when scanning a human head. Hence, the present invention may include a computer system 100 with stored data 154 containing a plurality of stored magnetic susceptibility gradient ranges corresponding to a number of different objects of different class, for example, different parts or regions of the body, wherein the magnetic susceptibility gradient range will not substantially differ between patients.

Various modifications, whether by way of addition, deletion or substitution may be made to the above described embodiments to provide further embodiments, any and all of which are intended to be encompassed by the appended claims.

REFERENCES

[1] Z. H. Cho and Y. M. Rho, "Reduction of Susceptibility Artifact in Gradient-Echo Imaging", *Magnetic Resonance in Medicine*, 23, 193-200, 1992

[2] J. Y. Chung, H. W. Yoon, Y. B. Kim, H. W. Park, Z. H. Cho, "Susceptibility Compensated fMRI Study Using a Tailored RF Echo Planar Imaging Sequence", *Journal of Magnetic Resonance Imaging*, 29, 221-228, 2009

[3] J. Mao and A. W. Song, "Intravoxel rephasing of spins dephased by susceptibility effect for EPI sequences", *In: Proceedings of the International Society for Magnetic Resonance in Medicine*, 1999, Philadelphia. p. 1982

[4] K. Shmueli, D. L. Thomas and R. Ordidge, "Signal Drop-Out Reduction in Gradient Echo Imaging with a Hyperbolic Secant Excitation Pulse—An Evaluation Using an Anthropomorphic Head Phantom", *In: Proceedings of the International Society for Magnetic Resonance in Medicine*, 2006 Seattle. p. 2385

[5] J. Frahm, M. Klaus-Dietmar, and H. Wolfgang, "Direct FLASH MR imaging of magnetic field inhomogeneities by gradient compensation", *Magnetic Resonance in Medicine*, 6, 4, 474-480, 1988

[6] R. R. Ernst and W. A. Anderson, "Application of Fourier transform spectroscopy to magnetic resonance", *Review of Scientific Instruments*, vol. 37, 1, 93-102, 1966

[7] M. Bernstein, K. King, and X. Zhou, "Handbook of MRI Pulse Sequences", Elsevier Academic Press, 2004

[8] B. A. Hargreaves, C. H. Cunningham, D. G. Nishimura, and S. M. Conolly, "Variable-Rate Selective Excitation for Rapid MRI Sequences", Magnetic Resonance in Medicine, 52, 590-597, 2004

[9] D. Weishaupt, V. D. Köchli and B. Marincek, "How does MRI work? An Introduction to the Physics and Function of Magnetic Resonance Imaging", 2nd Edition, Springer, Heidelberg Berlin, 2008

[10] R. H. Hashemi, W. G. Bradley Jr. and C. J. Lisanti, "MRI The Basics", 3rd Edition, Lippincott Williams & Wilkins, Philadelphia USA, 2010

[11] C. Westbrook, C. K. Roth and J. Talbot, "MRI In Practice", 4th Edition, Wiley-Blackwell, Oxford UK, 2011

The invention claimed is:

1. A method of performing a magnetic resonance (MR) scan, comprising:
  providing an MR scanner;
  calculating a plurality of parameters, wherein the calculating includes:
   i) defining a cost function, C, in dependence at least on:
    a) a determined range of magnetic susceptibility gradients, $G_{zs,min}<G_{zs}<G_{zs,max}$, of an object to be scanned;
    b) a quadratic phase variation, a, of a transverse magnetic field induced by an RF pulse;

c) a plurality of parameters defining a slice selection gradient, $G_z$, and a slice refocusing gradient, $G_{z,ref}$; and ii) determining a value of the quadratic phase variation, a, and values for the plurality of parameters defining the slice selection gradient, $G_z$, and the slice refocusing gradient, $G_{z,ref}$ such that the cost function, C, is maximised;

performing an MR scan on the object using the determined values to thereby obtain an MR signal of improved detectability over the determined range of magnetic susceptibility gradients; and generating an MR image or spectrum of the object based on the MR signal.

2. A method according to claim 1, wherein the RF pulse is a complex hyperbolic secant RF pulse.

3. A method according to claim 1, wherein the determined values reduce the signal dropout in the MR scan.

4. A method according to claim 1, wherein the cost function, C, is the minimum MR signal, $s_{min}$.

5. A method according to claim 1, wherein the cost function, C, is calculated for a value of the phase variation, a, using a Bloch simulation to determine the MR signal produced at a plurality of magnetic susceptibility gradient values over the determined range of magnetic susceptibility gradients.

6. A method according to claim 5, wherein the Bloch simulation includes calculating the transverse magnetisation for the plurality of magnetic susceptibility gradient values over determined range of magnetic susceptibility gradients.

7. A method according to claim 6, wherein the transverse magnetisation is calculated at the echo time, and at a plurality of spatial positions within the object.

8. A method according to claim 6, wherein the transverse magnetisation is numerically integrated to calculate the MR signal at the plurality of magnetic susceptibility gradient values, wherein the cost function, C, is determined from the MR signal over the determined range of magnetic susceptibility gradients.

9. A method according to claim 1, wherein the range of magnetic susceptibility gradients, $G_{zs,min} < G_{zs} < G_{zs,max}$, is determined by measuring the range of magnetic susceptibility gradients of the objects to be scanned.

10. A method according to claim 9, wherein the object to be scanned is a body part.

11. A method according to claim 1, wherein the range of magnetic susceptibility gradients, $G_{zs,min} < G_{zs} < G_{zs,max}$, is determined by measuring the range of magnetic susceptibility gradients for at least one object that is of the same class as the object to be scanned.

12. A method according to claim 11, wherein the object to be scanned is a body part.

13. A method according to claim 1, wherein the RF pulse is defined in dependence of at least one or more of the bandwidth $\Delta f$, the peak amplitude $A_0$, the RF pulse duration $T_{RF}$, the sampling period $\Delta t_{RF}$, the flip angle $\alpha$, and the degree of quadratic phase variation induced in the transverse magnetisation a.

14. A method according to claim 1, wherein the parameters of the slice-selection gradient include at least one or more the peak amplitude of the slice-selection gradient $G_z$, the time duration of the slice-selection gradient ramp, $T_{ramp}$, and the time duration of the slice-selection gradient plateau, $T_{plateau}$.

15. A method according to claim 1, wherein the parameters of the slice-refocusing gradient include at least one or more of the area of the slice-refocusing gradient $A_{ref}$, the peak amplitude of slice-refocusing gradient $G_{z,ref}$, the time duration of the slice-refocusing gradient ramp, $T_{ramp,ref}$, and the time duration of the slice-refocusing gradient plateau, $T_{plateau,ref}$.

16. A system for magnetic resonance (MR) imaging or spectroscopy, comprising:
an MR scanner arranged to:
perform an MR scan on an object using a plurality of parameters to generate an MR signal of improved detectability, wherein the parameters are calculated according to a method comprising:
i) defining a cost function, C, in dependence at least on:
a) a determined range of magnetic susceptibility gradients, $G_{zs,min} < G_{zs} < G_{zs,max}$, of an object to be scanned;
b) a quadratic phase variation, a, of a transverse magnetic field induced by an RF pulse;
c) a plurality of parameters defining a slice selection gradient, $G_z$, and a slice refocusing gradient, $G_{z,ref}$; and
ii) determining a value of the quadratic phase variation, a, and values for the plurality of parameters defining the slice selection gradient, $G_z$, and the slice refocusing gradient, $G_{z,ref}$ such that the cost function, C, is maximised; and
generate a MR image or spectrum of the objected based on the MR signal.

\* \* \* \* \*